(12) United States Patent
Hu et al.

(10) Patent No.: US 12,426,203 B2
(45) Date of Patent: Sep. 23, 2025

(54) LIQUID COOLING HEAT DISSIPATION SYSTEM

(71) Applicant: Delta Electronics, Inc., Taoyuan (TW)

(72) Inventors: Yi-You Hu, Taoyuan (TW);
Cheng-Tang Yeh, Taoyuan (TW);
Li-Kuang Tan, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 264 days.

(21) Appl. No.: 18/117,087

(22) Filed: Mar. 3, 2023

(65) Prior Publication Data

US 2024/0023275 A1    Jan. 18, 2024

(30) Foreign Application Priority Data

Jul. 15, 2022    (CN) .......................... 202221816836.5

(51) Int. Cl.
*H05K 7/20*    (2006.01)

(52) U.S. Cl.
CPC ..... *H05K 7/20254* (2013.01); *H05K 7/20263* (2013.01); *H05K 7/20272* (2013.01); *H05K 7/20409* (2013.01)

(58) Field of Classification Search
None
See application file for complete search history.

(56) References Cited

U.S. PATENT DOCUMENTS

| | | | |
|---|---|---|---|
| 8,596,338 B2 | 12/2013 | Chen et al. | |
| 8,925,339 B2 * | 1/2015 | Kearney | F25B 49/02 62/132 |
| 10,697,704 B2 | 6/2020 | Xiao | |
| 2010/0277865 A1 * | 11/2010 | Goth | F25B 49/02 361/679.53 |
| 2012/0111035 A1 * | 5/2012 | Campbell | F25B 25/005 62/190 |
| 2012/0125586 A1 * | 5/2012 | Chen | H05K 7/20809 165/177 |
| 2024/0003606 A1 * | 1/2024 | Kosowski | A23C 3/045 |

FOREIGN PATENT DOCUMENTS

| | | |
|---|---|---|
| CN | 102762075 A | 10/2012 |
| TW | I707116 B | 10/2020 |

* cited by examiner

*Primary Examiner* — Courtney L Smith
(74) *Attorney, Agent, or Firm* — KIRTON McCONKIE; Evan R. Witt

(57) ABSTRACT

A liquid cooling heat dissipation system is provided. The system includes a first heat dissipation device, a first heat absorption device, a second heat dissipation device, a second heat absorption device, and a pump connected with the first heat dissipation device, the first heat absorption device, the second heat dissipation device or the second heat absorption device. The first heat dissipation device, the first heat absorption device, the second heat dissipation device and the second heat absorption device are connected in sequence.

13 Claims, 9 Drawing Sheets

LIQUID COOLING HEAT DISSIPATION SYSTEM

CROSS-REFERENCE TO RELATED APPLICATION

This application claims priority to China Patent Application No. 202221816836.5, filed on Jul. 15, 2022. The entire contents of the above-mentioned patent application are incorporated herein by reference for all purposes.

FIELD OF THE INVENTION

The present disclosure relates to a liquid cooling heat dissipation system, and more particularly to a liquid cooling heat dissipation system capable of providing substantially equal capabilities of heat absorption for a plurality of heat absorption devices therein.

BACKGROUND OF THE INVENTION

Please refer FIG. 1 and FIG. 2. FIG. 1 is a schematic view showing a conventional liquid cooling heat dissipation system, and FIG. 2 is a schematic view showing a flowing sequence of a working fluid in the liquid cooling heat dissipation system of FIG. 1. A liquid cooling heat dissipation system 1 is designed to adopt a series connection, wherein an outlet 111 of a heat dissipation device 11 is connected with a pump 12a via a connection pipe 14a, the pump 12a is connected with a heat absorption device 13a via a connection pipe 14b, the heat absorption device 13a is connected with a pump 12b via a connection pipe 14c, the pump 12b is connected with a heat absorption device 13b via a connection pipe 14d, and the heat absorption device 13b is connected with an inlet 112 of the heat dissipation device 11 via a connection pipe 14e. In this closed loop, a working fluid 15 continuously and circularly flows in accordance with the flow sequence as shown in FIG. 2, so that heats from two heat-producing elements (not shown, e.g., chips or CPUs) which are respectively contacted with the heat absorption devices 13a, 13b can be taken away by the working fluid 15 through a heat exchanging therebetween.

However, the system mentioned above has some defects. When the working fluid 15 flows through the first heat absorption device 13a, the temperature thereof raises because of the absorbed heats from the heat-producing element contacted therewith. Thus, the working fluid 15 is in a preheated state with a raised temperature when it sequentially flows into the second heat absorption device 13b. Accordingly, the heat absorption capability of the second heat absorption device 13b is reduced, and the heats from the heat-producing element contacted with the second heat absorption device 13b cannot be removed effectively.

Therefore, there is a need of providing a liquid cooling heat dissipation system for solving the defects above.

SUMMARY OF THE INVENTION

An object of the present disclosure is to provide a liquid cooling heat dissipation system which, through varying the connection relationship of heat absorption devices and heat dissipation devices therein, provides each of the heat absorption devices a substantially equal capability of heat absorption.

An additional object of the present disclosure is to provide a liquid cooling heat dissipation system in which the heat absorption devices and the heat dissipation devices are alternately connected in series for ensuring a working fluid to be heat dissipated by at least one of the heat absorption devices before flowing into each of the heat absorption device.

In accordance with an aspect of the present invention, a liquid cooling heat dissipation system is provided. The liquid cooling heat dissipation system includes a first heat dissipation device, a first heat absorption device, a second heat dissipation device, a second heat absorption device, and a pump. The first heat dissipation device includes a first inlet and a first outlet, the first heat absorption device includes a second inlet and a second outlet, the second heat dissipation device includes a third inlet and a third outlet, the second heat absorption device includes a fourth inlet and a fourth outlet, and the pump includes a liquid inlet and a liquid outlet. The first outlet is connected to the second inlet, the second inlet is connected to the third inlet, and the third outlet is connected to the fourth inlet. The liquid inlet is connected with the first outlet and the liquid outlet is connected with the second inlet, the liquid inlet is connected with the second outlet and the liquid outlet is connected with the third inlet, the liquid inlet is connected with the third outlet and the liquid outlet is connected with the fourth inlet, the liquid inlet is connected with the fourth outlet, or the liquid outlet is connected with the first inlet.

In an embodiment, the first heat dissipation device and the second heat dissipation device are configured to dispose separately or combine with each other.

In an embodiment, the first heat dissipation device and the second heat dissipation device are configured to be adjacent to each other.

In an embodiment, the first heat dissipation device and the second heat dissipation device are configured to stack on each other.

In an embodiment, at least one of the first heat dissipation device and the second heat dissipation device comprises at least one of at least one fin and at least one fan.

In an embodiment, at least one of the first heat absorption device and the second heat absorption device is configured to be a liquid cooling plate or a liquid cooler with pump.

In accordance with another aspect of the present invention, a liquid cooling heat dissipation system is provided. The system includes a first heat dissipation device, a first heat absorption device, a second heat dissipation device, a second heat absorption device, a pump, and a working fluid. The first heat dissipation device includes a first inlet and a first outlet, the first heat absorption device includes a second inlet and a second outlet, the second heat dissipation device includes a third inlet and a third outlet, the second heat absorption device includes a fourth inlet and a fourth outlet, and the pump includes a liquid inlet and a liquid outlet. The working fluid is driven by the pump to flow through the first outlet, the second inlet, the second outlet, the third inlet, the third outlet and the fourth inlet in sequence. The liquid inlet is connected with the first outlet and the liquid outlet is connected with the second inlet, the liquid inlet is connected with the second outlet and the liquid outlet is connected with the third inlet, the liquid inlet is connected with the third outlet and the liquid outlet is connected with the fourth inlet, the liquid inlet is connected with the fourth outlet, or the liquid outlet is connected with the first inlet.

In an embodiment, the working fluid includes one selected from the group consisting of water, alcohol, refrigerants and antifreezes.

In accordance with still another aspect of the present invention, a liquid cooling heat dissipation system is provided. The system includes a first heat dissipation device, a first heat absorption device, a second heat dissipation device, a second heat absorption device, a pump. The pump is connected with the first heat dissipation device, the first heat absorption device, the second heat dissipation device or the second heat absorption device. The first heat dissipation device, the first heat absorption device, the second heat dissipation device and the second heat absorption device are connected in sequence.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
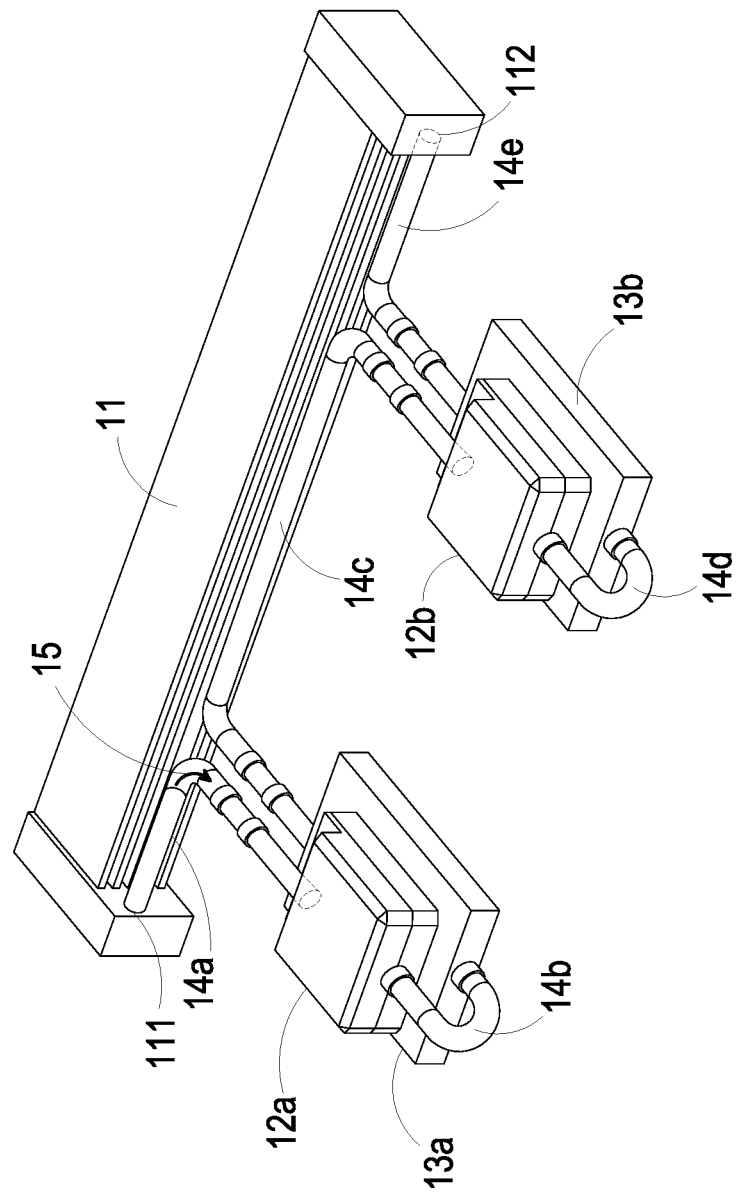
FIG. 1 is a schematic view showing a conventional liquid cooling heat dissipation system.
Figure 2:
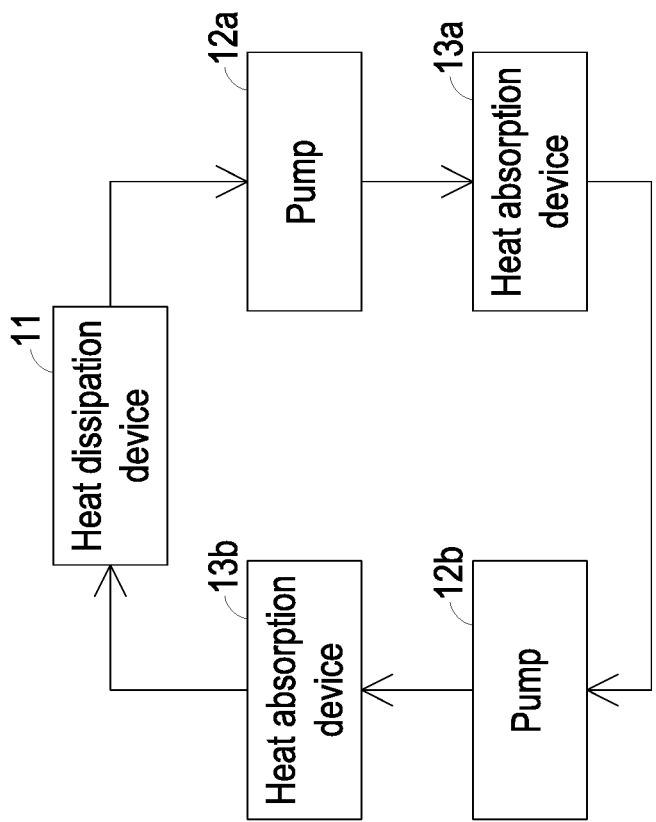
FIG. 2 is a schematic view showing a flowing sequence of a working fluid in the liquid cooling heat dissipation system of FIG. 1.
Figure 3:
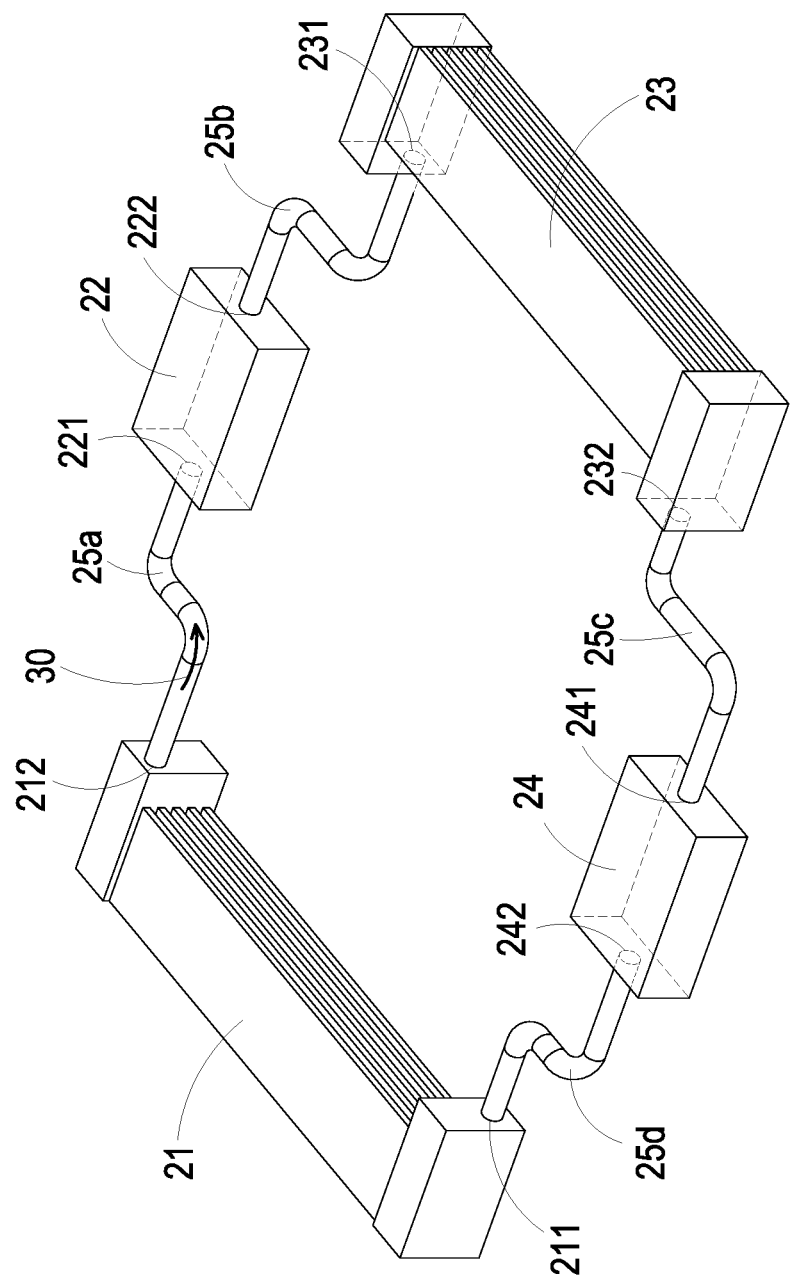
FIG. 3 is a schematic view showing a liquid cooling heat dissipation system according to an embodiment of the present disclosure.
Figure 4:
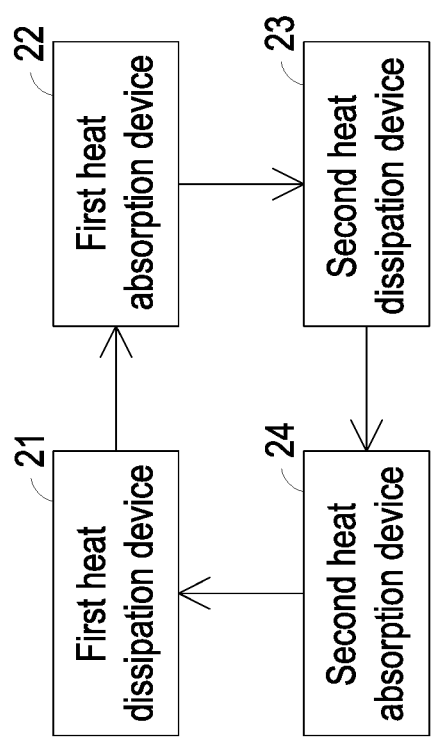
FIG. 4 is a schematic view showing a flowing sequence of a working fluid in the liquid cooling heat dissipation system of FIG. 3.

Please refer to FIG. 3 and FIG. 4. FIG. 3 is a schematic view showing a liquid cooling heat dissipation system according to an embodiment of the present disclosure, and FIG. 4 is a schematic view showing a flowing sequence of a working fluid in the liquid cooling heat dissipation system of FIG. 3. A liquid cooling heat dissipation system 2 includes a first heat dissipation device 21, a first heat absorption device 22, a second heat dissipation device 23, a second heat absorption device 24 and a working fluid 30. The first heat dissipation device 21 includes a first inlet 211 and a first outlet 212, the first heat absorption device 22 includes a second inlet 221 and a second outlet 222, the second heat dissipation device 23 includes a third inlet 231 and a third outlet 232, and the second heat absorption device 24 includes a fourth inlet 241 and a fourth outlet 242. Further, a connection pipe 25a is used to connect from the first outlet 212 to the second inlet 221, a connection pipe 25b is used to connect from the second outlet 222 to the third inlet 231, a connection pipe 25c is used to connect from the third outlet 232 to the fourth inlet 241, and a connection pipe 25d is used to connect from the fourth outlet 242 to the first inlet 211, so that the first heat dissipation device 21, the first heat absorption device 22, the second heat dissipation device 23 and the second heat absorption device 24 are connected and in fluid communication.

Under this architecture, as shown in FIG. 4, the working fluid 30 accommodated in the liquid cooling heat dissipation system 2 sequentially flows through the first heat dissipation device 21, the first heat absorption device 22, the second heat dissipation device 23 and the second heat absorption device 24, and then flows back to the first heat dissipation device 21, thereby continuously circling in the system 2.

The first heat absorption device 22 and the second heat absorption device 24 are respectively used to contact with a heat-producing element (not shown), so that the heats from the heat-producing element is absorbed and taken away by the working fluid 30 flowing therethrough via a heat exchanging. The first heat dissipation device 21 and the second heat dissipation device 23 are respectively used for dissipating the heats of the working fluid 30 that are absorbed as passing through the second heat absorption device 24 and the first heat absorption device 22, thereby removing the heats in the system 2.

In other words, through the arranged sequence of the heat dissipation devices and the heat absorption devices described above, before the working fluid 30 flows into each of the heat absorption devices, the heats absorbed by the working fluid 30 are dissipated by one of the heat dissipation devices, namely, the working fluid 30 flows into a next heat absorption device only after the heats absorbed in a previous heat absorption device are removed by the heat dissipation device. Accordingly, each of the heat absorption devices can provide a substantially equal capability of heat absorption, and the heat dissipation effect for each of the heat-producing elements can be substantially the same.

Figure 5:
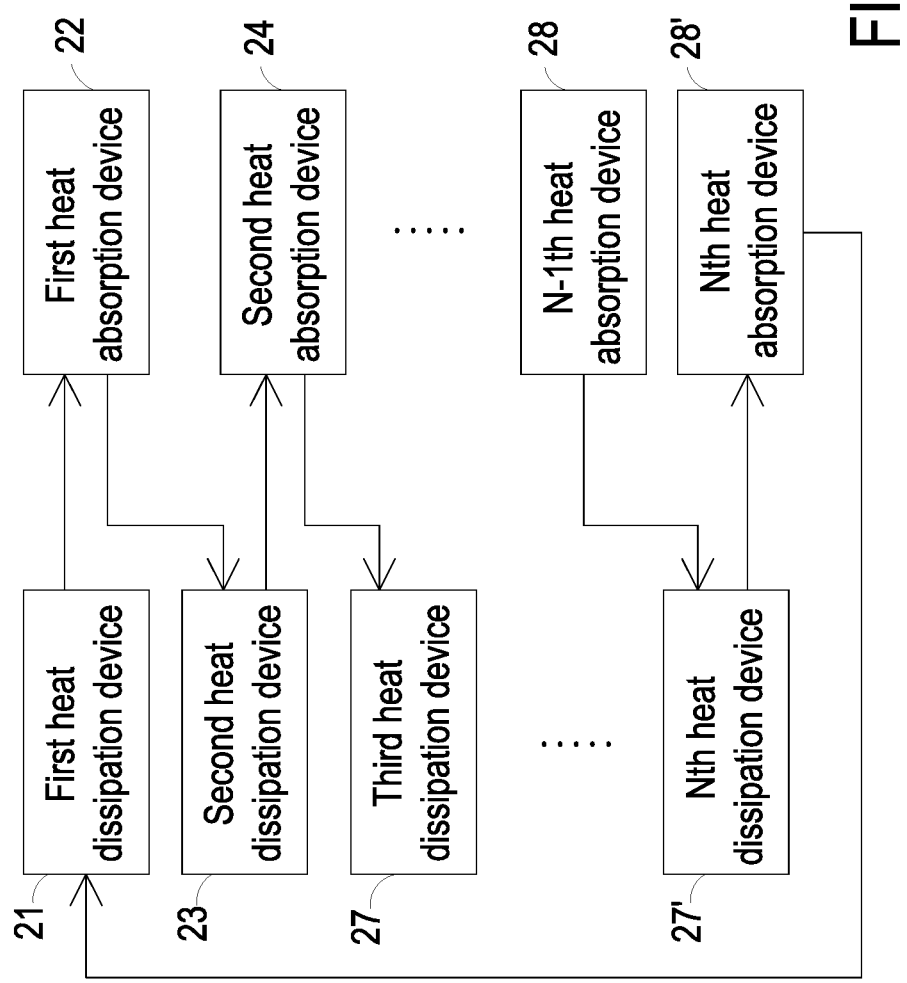
FIG. 5 is a schematic view showing a flowing sequence of the working fluid in the liquid cooling heat dissipation system according to another embodiment of the present disclosure.

Please refer to FIG. 5 which is a schematic view showing a flowing sequence of the working fluid in the liquid cooling heat dissipation system according to another embodiment of the present disclosure. As shown in FIG. 5, the numbers of the heat dissipation devices and the heat absorption devices in the present disclosure are not limited and can be increased in accordance with practical demands. The concept is the heat dissipation devices and the heat absorption devices are arranged alternately in a series connection and one heat dissipation device is cooperated with one heat absorption device, such that the working fluid can flow through one heat dissipation device after one heat absorption device in an alternating sequence. For example, when there are N heat absorption devices in the system, it correspondingly also has N heat dissipation devices, in that the working fluid 30 flows in sequence through the first heat dissipation device 21, the first heat absorption device 22, the second heat dissipation device 23, the second heat absorption device 24, . . . , the N−1th heat absorption device 28, the Nth heat dissipation device 27' and the Nth heat absorption device 28', and then flows back to the first heat dissipation device 21. Therefore, it can ensure that the heats absorbed by the working fluid 30 are dissipated before the working fluid 30 flows into every heat absorption device.

Figure 6:
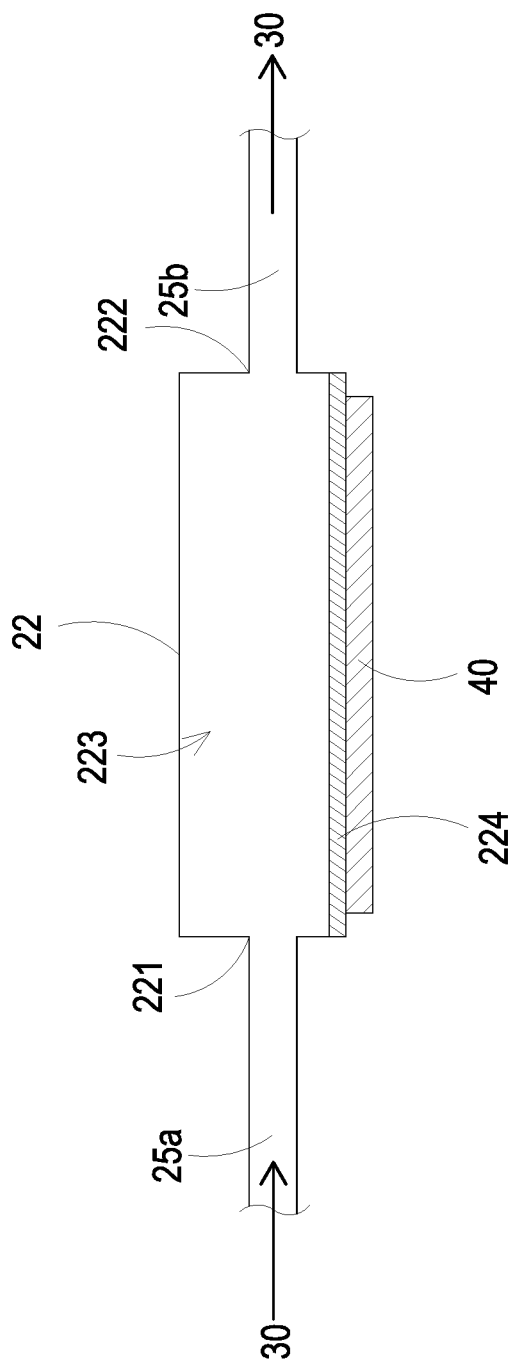
FIG. 6 is a sectional view showing the first heat absorption device according to an embodiment of the present disclosure.

Please refer FIG. 6 which is a sectional view showing the first heat absorption device 22 according to an embodiment of the present disclosure. For simplifying the descriptions, only the structural details of the first heat absorption device 22 are provided, and the descriptions below are also applicable to the second heat absorption device 24, which has a similar structure to the first heat absorption device 22, without limitation. The first heat absorption device 22 includes a chamber 223 and a heat exchanging surface 224. The chamber 223 is provided for flowing therethrough the working fluid 30, and the heat exchanging surface 224 is used to contact with a heat-producing element 40. Therefore, through the heat exchanging between the heat-producing element 40 and the working fluid 30, the heats from the heat-producing element 40 are transferred to the working surface 30 via the heat-exchanging surface 224 and taken out of the first heat absorption device 22 as the working fluid 30 flows through the second outlet 222, thereby achieving the effect of reducing the temperature of the heat-producing element 40.

Accordingly, it is known that, for the liquid cooling heat dissipation system, the temperature at which the working fluid 30 enters the heat absorption device determines the heat absorption capability of the working fluid 30 for said heat absorption device. Thus, if the temperature of the working fluid 30 can be reduced (namely, the heats in the working fluid 30 can be reduced) before the working fluid 30 flows into the heat absorption device, the heat absorption capability of the working fluid 30 can be significantly improved. Consequently, in the present disclosure, the heat dissipation device and the heat absorption device are alternately connected in series to ensure that the working fluid is dissipated, that is, maintained at a low temperature, before entering each of the heat absorption devices, so that the heat absorption capability of each of the heat absorption devices can be substantially the same, and the situation that the working fluid is preheated before entering the heat absorption device also can be avoided.

In some embodiments, the heat absorption devices 22, 24 are respectively configured to be a liquid cooling plate, and the heat-producing element 40 which is contacted with the liquid cooling plate is an element with high heat production, such as a chip or a CPU. Further, the working fluid 30 can be any applicable fluid for the liquid cooling heat dissipation system, such as water, alcohol, refrigerants and antifreezes etc.

Figure 7:
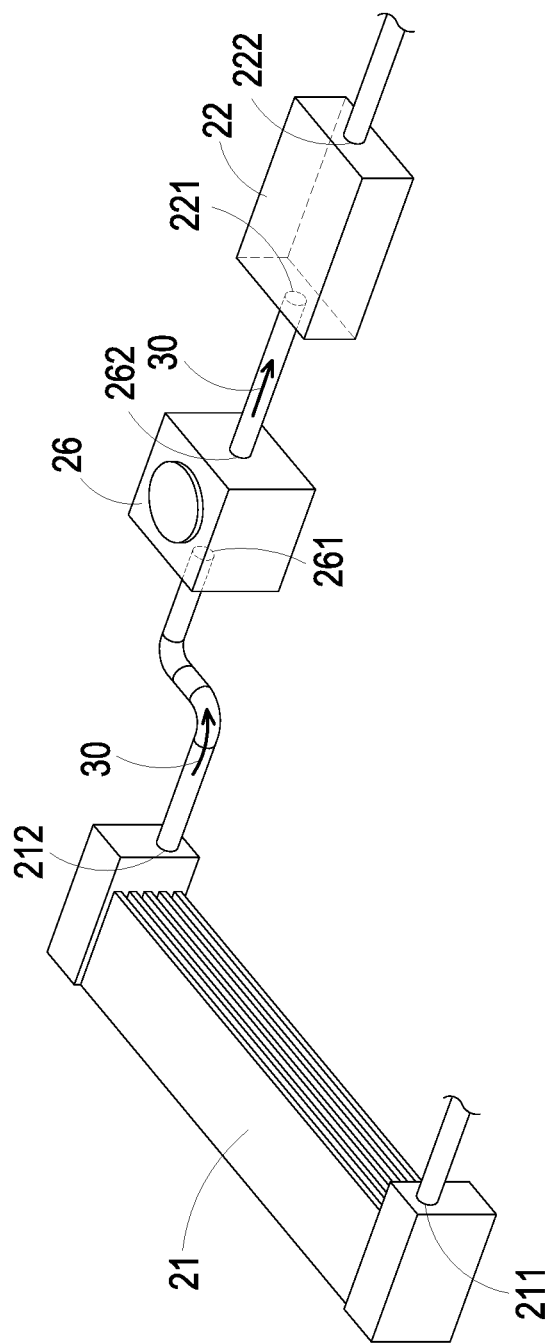
FIG. 7 is a schematic view showing a portion of the liquid cooling heat dissipation system according to another embodiment of the present disclosure.

Please further refer to FIG. 7 which is a schematic view showing a portion of the liquid cooling heat dissipation system according to another embodiment of the present disclosure. The liquid cooling heat dissipation system 2 further includes a pump 26 disposed between the first heat dissipation device 21 and the first heat absorption device 22. The pump 26 includes a liquid inlet 261 and a liquid outlet 262, wherein the liquid inlet 261 is connected with the first outlet 212 of the first heat dissipation device 21, and the liquid outlet 262 is connected with the first inlet 221 of the first heat absorption device 22. Through this arrangement, the pump 26 can drive the working fluid 30 to flow in the system 2 so as to achieve the purpose of heat exchanging. Other than the arrangement as shown in FIG. 7 in which the pump 26 is located between the first heat dissipation device 21 and the first heat absorption device 22, the number and the arranging position of the pump in the system 2 also can be varied depending on different demands. For example, the pump 26 also can be disposed between the first heat absorption device 22 and the second heat dissipation device 23, between the second heat dissipation device 23 and the second heat absorption device 24, or between the second heat absorption device 24 and the first heat dissipation device 21, but not limited thereto. Because the working fluid 30 circularly flows in the system 2, the pump 26 only needs to be disposed in a flowing path of the working fluid and the working fluid 30 can be driven thereby, so that the position thereof can be varied, e.g., depending on the setting space of the system 2, without limitation.

Figure 8:
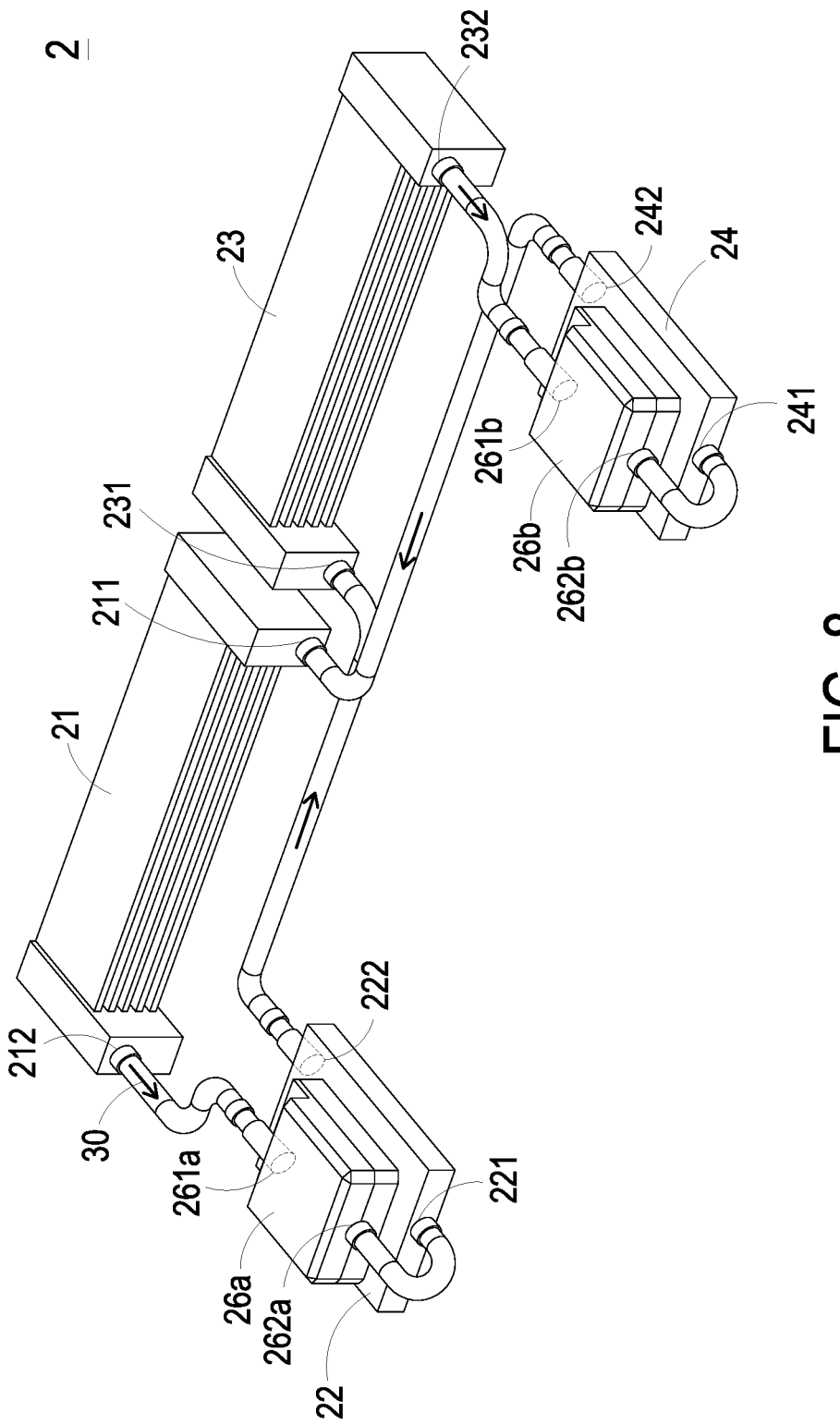
FIG. 8 is a schematic view showing the liquid cooling heat dissipation system according to another embodiment of the present disclosure.

Please refer to FIG. 8 which is a schematic view showing the liquid cooling heat dissipation system according to another embodiment of the present disclosure. In this embodiment, two pumps are provided, including a first pump 26a and a second pump 26b which are respectively accompany with the first heat absorption device 22 and the second heat absorption device 24, for example, in the form of a cooling cooler with pump. The first pump 26a includes a first liquid inlet 261a and a first liquid outlet 262a, and the second pump 26b includes a first liquid inlet 261b and a second liquid outlet 262b. The arrangement is the first outlet 212 is connected with the first liquid inlet 261a, the first liquid outlet 262a is connected with the second inlet 221, the second outlet 222 is connected with the third inlet 231, the third outlet 232 is connected with the second liquid inlet 261b, the second liquid outlet 262b is connected with the fourth inlet 241, and the fourth outlet 242 is connected with the first inlet 211. This arrangement is advantageous that even one of the pumps becomes malfunction, the working fluid 30 still can be driven by another pump, thereby avoiding the situation that the heats and the temperatures of the heat-producing elements cannot be reduced due to the non-moving working fluid 30.

Figure 9:
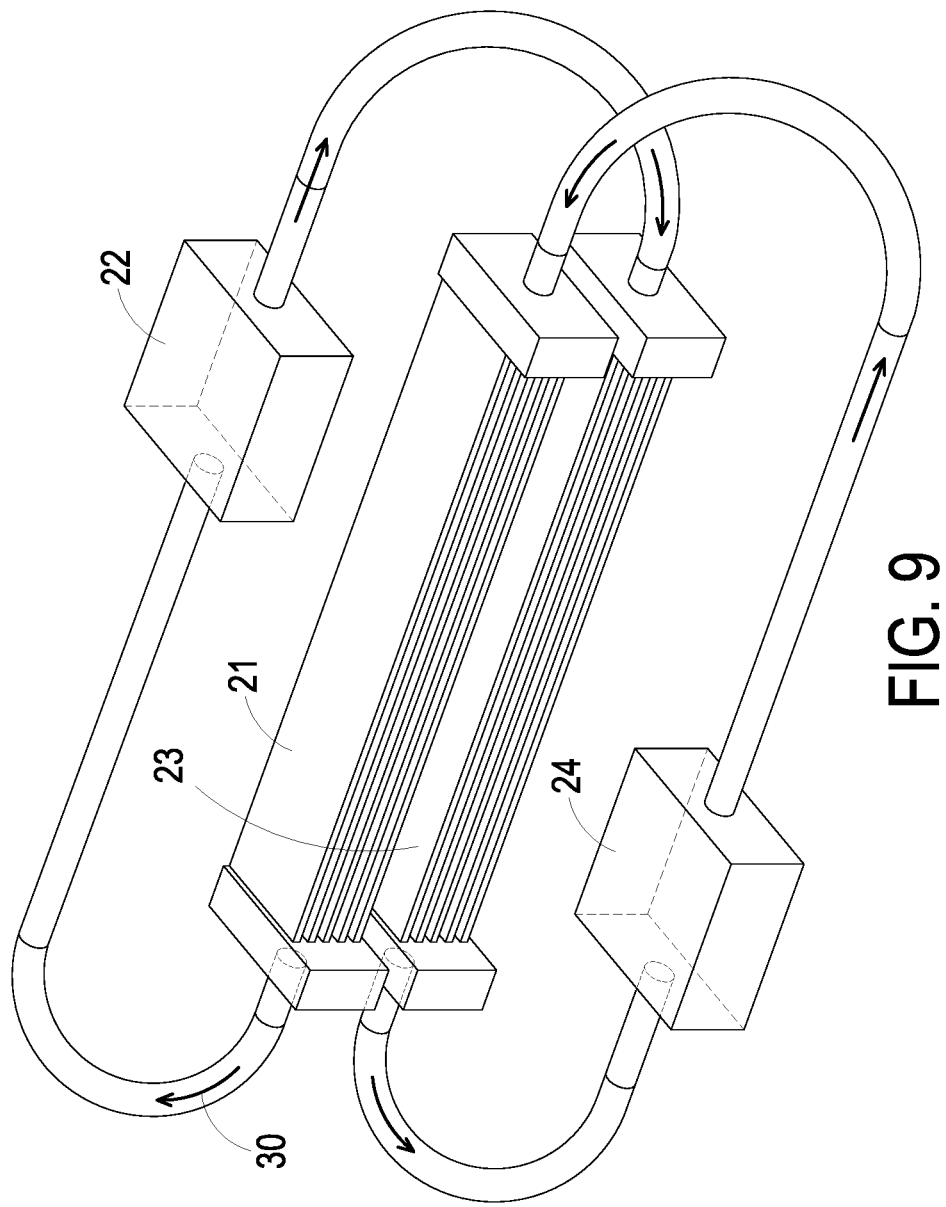
FIG. 9 is a schematic view showing the liquid cooling heat dissipation system according to another embodiment of the present disclosure.

Please further refer to FIG. 8 and FIG. 9. FIG. 9 is a schematic view showing the liquid cooling heat dissipation system according to another embodiment of the present disclosure. The structural design and the arrangement of the first heat dissipation device 21 and the second heat dissipation device 23 can be further varied in accordance with the setting space for the liquid cooling heat dissipation system 2. For example, if the setting space is in a cuboid shape, the first heat dissipation device 21 and the second heat dissipation device 23 can be configured to be adjacent to each other, as shown in FIG. 8, in which the respective heat dissipation surfaces of the first heat dissipation device 21 and the second heat dissipation device 23 are adjacent to each other along one direction, or configured to stack on each other, as shown in FIG. 9, in which the respective heat dissipation surfaces of the first heat dissipation device 21 and the second heat dissipation device 23 are stack on each other along one direction. Alternatively, the first heat dissipation device 21 and the second heat dissipation device 23 also can be disposed separately to match the available spaces, as shown in FIG. 3, through varying the length of the connection pipes, and thus provide the flexibility. In addition, each of the heat dissipation devices can further include at least one fin and/or at least one fan which are beneficial of improving the heat dissipation efficiency thereof, but not limited thereto.

In conclusion, through adopting identical numbers of heat dissipation devices and heat absorption devices and alternately connecting the heat dissipation devices and the heat absorption devices, the liquid cooling heat dissipation system of the present disclosure can advantageously keep the working fluid at a substantially identical low temperature as flowing through each of the heat absorption devices, so as to provide every heat absorption device a substantially equal capability of heat absorption.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A liquid cooling heat dissipation system, comprising:
a first heat dissipation device having a first inlet and a first outlet;
a first heat absorption device having a second inlet and a second outlet;
a second heat dissipation device having a third inlet and a third outlet;
a second heat absorption device having a fourth inlet and a fourth outlet;
a pump having a liquid inlet and a liquid outlet; and
a working fluid driven by the pump to flow through the first outlet, the second inlet, the second outlet, the third inlet, the third outlet and the fourth inlet in sequence,
wherein the liquid inlet is directly fluidly connected with the fourth outlet.

2. The liquid cooling heat dissipation system as claimed in claim 1, wherein at least one of the first heat absorption device and the second heat absorption device is configured to be a liquid cooling plate or a liquid cooler with pump.

3. The liquid cooling heat dissipation system as claimed in claim 1, wherein the first heat dissipation device and the second heat dissipation device are configured to dispose separately or combine with each other.

4. The liquid cooling heat dissipation system as claimed in claim 1, wherein the first heat dissipation device and the second heat dissipation device are configured to be adjacent to each other.

5. The liquid cooling heat dissipation system as claimed in claim 1, wherein the first heat dissipation device and the second heat dissipation device are configured to stack on each other.

6. The liquid cooling heat dissipation system as claimed in claim 1, wherein at least one of the first heat dissipation device and the second heat dissipation device comprises at least one of at least one fin and at least one fan.

7. The liquid cooling heat dissipation system as claimed in claim 1, wherein the working fluid comprises one selected from the group consisting of water, alcohol, refrigerants and antifreezes.

8. A liquid cooling heat dissipation system, comprising:
a first heat dissipation device;
a first heat absorption device;
a second heat dissipation device;
a second heat absorption device; and
a pump,
wherein the pump, the first heat dissipation device, the first heat absorption device, the second heat dissipation device and the second heat absorption device are connected in sequence.

9. The liquid cooling heat dissipation system as claimed in claim 8, wherein at least one of the first heat absorption device and the second heat absorption device is configured to be a liquid cooling plate or a liquid cooler with pump.

10. The liquid cooling heat dissipation system as claimed in claim 8, wherein at least one of the first heat dissipation device and the second heat dissipation device comprises at least one of at least one fin and at least one fan.

11. The liquid cooling heat dissipation system as claimed in claim 8, wherein the first heat dissipation device and the second heat dissipation device are configured to dispose separately or combine with each other.

12. The liquid cooling heat dissipation system as claimed in claim 8, wherein the first heat dissipation device and the second heat dissipation device are configured to be adjacent to each other.

13. The liquid cooling heat dissipation system as claimed in claim 8, wherein the first heat dissipation device and the second heat dissipation device are configured to stack on each other.

* * * * *